United States Patent
Koss et al.

(10) Patent No.: US 12,010,471 B2
(45) Date of Patent: *Jun. 11, 2024

(54) WOODEN OR OTHER DIELECTRIC CAPACITIVE TOUCH INTERFACE AND LOUDSPEAKER HAVING SAME

(71) Applicant: Koss Corporation, Milwaukee, WI (US)

(72) Inventors: Michael J. Koss, Milwaukee, WI (US); Michael J. Pelland, Princeton, WI (US); Nicholas Blair, Whitefish, WI (US)

(73) Assignee: Koss Corporation, Milwaukee, WI (US)

( * ) Notice: Subject to any disclaimer, the term of this patent is extended or adjusted under 35 U.S.C. 154(b) by 53 days.

This patent is subject to a terminal disclaimer.

(21) Appl. No.: 17/712,278

(22) Filed: Apr. 4, 2022

(65) Prior Publication Data
US 2022/0225000 A1    Jul. 14, 2022

Related U.S. Application Data

(63) Continuation of application No. 17/066,047, filed on Oct. 8, 2020, which is a continuation of application
(Continued)

(51) Int. Cl.
*H04R 1/02* (2006.01)
*H03G 3/02* (2006.01)
(Continued)

(52) U.S. Cl.
CPC ................ *H04R 1/02* (2013.01); *H03G 3/02* (2013.01); *H03K 17/9622* (2013.01);
(Continued)

(58) Field of Classification Search
CPC ...... G06F 3/044; G06F 3/0412; G06F 3/0416; H04R 1/02; H04R 3/00; H04R 2420/07
(Continued)

(56) References Cited

U.S. PATENT DOCUMENTS

| 4,872,527 A | 10/1989 | Han |
| 7,190,972 B1 | 3/2007 | Hollister et al. |

(Continued)

FOREIGN PATENT DOCUMENTS

| CA | 2727672 A1 | 7/2012 |
| CN | 202172482 U | 3/2012 |

(Continued)

OTHER PUBLICATIONS

International Preliminary Report on Patentability of the International Preliminary Examining Authority for International Application No. PCT/US2014/063847 dated Mar. 9, 2016.
(Continued)

*Primary Examiner* — Carolyn R Edwards

(57) ABSTRACT

Wireless-enabled loudspeaker includes a capacitive touch user interface. The loudspeaker may comprise at least one electroacoustic transducer, a processor in communication with the at least one electroacoustic transducer, and an exterior surface comprising a capacitive touch user interface that allows a user to control operation of the loudspeaker. The exterior surface acts a dielectric for the capacitive touch user interface. The loudspeaker may comprise a wireless transceiver circuit for receiving and transmitting wireless communication signals via a wireless network. The wireless transceiver circuit may receive wirelessly audio content from streaming audio content servers that are connected to the Internet. The capacitive touch user interface comprises a plurality of capacitive sense electrodes.

32 Claims, 7 Drawing Sheets

Related U.S. Application Data

No. 16/997,004, filed on Aug. 19, 2020, now Pat. No. 10,856,059, which is a continuation of application No. 16/152,014, filed on Oct. 4, 2018, now Pat. No. 10,785,550, which is a continuation of application No. 15/468,590, filed on Mar. 24, 2017, now Pat. No. 10,291,972, which is a continuation of application No. 14/094,277, filed on Dec. 2, 2013, now Pat. No. 9,628,880.

(51) Int. Cl.
| | |
|---|---|
| H03K 17/96 | (2006.01) |
| H04H 20/95 | (2008.01) |
| H04M 1/02 | (2006.01) |
| H04R 1/10 | (2006.01) |
| H04R 3/00 | (2006.01) |
| H04R 5/033 | (2006.01) |
| H04R 5/04 | (2006.01) |
| H04W 4/80 | (2018.01) |
| H04W 48/20 | (2009.01) |
| H04L 101/668 | (2022.01) |
| H04R 25/00 | (2006.01) |
| H04W 84/12 | (2009.01) |
| H04W 84/18 | (2009.01) |

(52) U.S. Cl.
CPC .......... *H04H 20/95* (2013.01); *H04M 1/0254* (2013.01); *H04R 1/028* (2013.01); *H04R 1/1041* (2013.01); *H04R 1/1091* (2013.01); *H04R 3/00* (2013.01); *H04R 5/033* (2013.01); *H04R 5/04* (2013.01); *H04W 4/80* (2018.02); *H04W 48/20* (2013.01); *H03K 2217/960785* (2013.01); *H04L 2101/668* (2022.05); *H04R 25/554* (2013.01); *H04R 2201/103* (2013.01); *H04R 2201/107* (2013.01); *H04R 2225/55* (2013.01); *H04R 2420/07* (2013.01); *H04W 84/12* (2013.01); *H04W 84/18* (2013.01)

(58) Field of Classification Search
USPC ..... 381/59, 77, 109, 334; 345/173–174, 178
See application file for complete search history.

(56) References Cited

U.S. PATENT DOCUMENTS

| | | |
|---|---|---|
| 7,564,678 B2 | 7/2009 | Langberg et al. |
| 7,571,014 B1 | 8/2009 | Lambourne et al. |
| 7,660,602 B2 | 2/2010 | Berman et al. |
| 7,844,920 B2 | 11/2010 | Jha |
| 7,932,897 B2 | 4/2011 | Elias et al. |
| 7,983,615 B2 | 7/2011 | Bryce et al. |
| 8,052,437 B2 | 11/2011 | Jiang et al. |
| 8,190,203 B2 | 5/2012 | Pelland et al. |
| 8,519,963 B2 | 8/2013 | Kocienda et al. |
| 8,571,544 B2 | 10/2013 | Pelland et al. |
| 8,588,949 B2 | 11/2013 | Lambourne et al. |
| 8,749,523 B2 | 6/2014 | Pance et al. |
| 8,768,252 B2 | 7/2014 | Cook et al. |
| 8,838,029 B2 | 9/2014 | Goldman et al. |
| 8,913,755 B2 | 12/2014 | Tracy |
| 9,021,108 B2 | 4/2015 | Brown et al. |
| 9,049,502 B2 | 6/2015 | Pelland et al. |
| 9,094,706 B2 | 7/2015 | Reilly et al. |
| 9,119,000 B2 | 8/2015 | Tracy |
| 9,130,770 B2 | 9/2015 | Millington |
| 9,189,143 B2 | 11/2015 | Jones et al. |
| 9,271,525 B2 | 3/2016 | Lindemann et al. |
| 9,414,232 B2 | 8/2016 | Louboutin et al. |
| 9,628,880 B2 | 4/2017 | Koss et al. |
| 9,960,959 B2 | 5/2018 | Flacco et al. |
| 10,079,717 B2 | 9/2018 | Koss et al. |
| 10,271,078 B2 | 4/2019 | Beckhardt et al. |
| 10,291,972 B2 | 5/2019 | Koss et al. |
| 10,298,451 B1 | 5/2019 | Koss et al. |
| 10,601,652 B2 | 3/2020 | Koss et al. |
| 10,680,884 B2 | 6/2020 | Koss et al. |
| 2004/0204743 A1 | 10/2004 | McGrath et al. |
| 2004/0223622 A1 | 11/2004 | Lindemann et al. |
| 2005/0226455 A1 | 10/2005 | Aubauer et al. |
| 2007/0033197 A1 | 2/2007 | Scherzer et al. |
| 2007/0086394 A1 | 4/2007 | Yamada et al. |
| 2007/0092088 A1 | 4/2007 | Chang |
| 2007/0223725 A1 | 9/2007 | Neumann et al. |
| 2007/0245028 A1 | 10/2007 | Baxter et al. |
| 2008/0044050 A1* | 2/2008 | Bhakta .................. H04R 1/02 381/335 |
| 2008/0143683 A1 | 6/2008 | Hotelling |
| 2009/0244026 A1 | 10/2009 | Purdy et al. |
| 2009/0249459 A1 | 10/2009 | Coughlin et al. |
| 2009/0296956 A1 | 12/2009 | Gregory |
| 2009/0315708 A1 | 12/2009 | Walley et al. |
| 2010/0081375 A1 | 4/2010 | Rosenblatt et al. |
| 2010/0082784 A1 | 4/2010 | Rosenblatt et al. |
| 2010/0115262 A1 | 5/2010 | Suyama et al. |
| 2010/0156846 A1 | 6/2010 | Long et al. |
| 2010/0165879 A1 | 7/2010 | Gupta et al. |
| 2010/0307916 A1 | 12/2010 | Ramey et al. |
| 2011/0025879 A1 | 2/2011 | Drader et al. |
| 2011/0100727 A1* | 5/2011 | Choi .................. G06F 3/0444 178/18.01 |
| 2011/0103609 A1 | 5/2011 | Pelland et al. |
| 2011/0289229 A1 | 11/2011 | Subramaniam |
| 2012/0054493 A1 | 3/2012 | Bradley |
| 2012/0213382 A1 | 8/2012 | Tracy |
| 2012/0293447 A1 | 11/2012 | Heng et al. |
| 2013/0014232 A1 | 1/2013 | Louboutin et al. |
| 2013/0083946 A1 | 4/2013 | Liu |
| 2013/0084835 A1 | 4/2013 | Scherzer et al. |
| 2013/0115915 A1 | 5/2013 | Tipton et al. |
| 2013/0191749 A1 | 7/2013 | Coburn, IV et al. |
| 2013/0254692 A1 | 9/2013 | Han |
| 2013/0266152 A1 | 10/2013 | Haynie et al. |
| 2013/0294638 A1 | 11/2013 | Huseby et al. |
| 2013/0309971 A1 | 11/2013 | Kiukkonen et al. |
| 2014/0064511 A1 | 3/2014 | Desai |
| 2014/0007209 A1 | 7/2014 | Zucker |
| 2014/0233545 A1 | 8/2014 | Ferguson-Jarnes et al. |
| 2014/0242913 A1 | 8/2014 | Pang |
| 2014/0279122 A1 | 9/2014 | Luna |
| 2015/0135208 A1 | 5/2015 | Itagaki |
| 2017/0194175 A1 | 7/2017 | Janisch et al. |
| 2017/0272848 A1 | 9/2017 | Koss et al. |

FOREIGN PATENT DOCUMENTS

| | | |
|---|---|---|
| WO | 0178443 A2 | 10/2001 |
| WO | 2004107806 A1 | 12/2004 |
| WO | 2013151878 A1 | 10/2013 |

OTHER PUBLICATIONS

International Search Report and Written Opinion of the International Searching Authority for International Application No. PCT/US2014/063847 dated Jan. 23, 2015.
Brodnick, Review—Koss Striva could be the next big platform to enjoy music, https://www.brightsideofnews.com/2012/05/14/reivew-koss-striva-could-be-the-next-big-platform-to-enjoy-music/ (May 14, 2012).
Robson, Koss Striva MyKoss Wi-fi Streaming—Tips and Tricks, http://www.audioholics.com/headphone-reviews/koss-striva-pro-wi-fi-headphone-review/mykoss-wifi-streaming-2013-tips-and-tricks/ (Jul. 3, 2012).
Robson, Interview: Michael J. Koss introduces STRIVA Wi-Fi Headphones, http://www.audioholics.com/editorials/michael-j-koss-striva/ (Jun. 7, 2012).
Sony Corporation, Quick Start Guide, 2012, 4-295-602-31(1), China (2 pages).

(56) References Cited

OTHER PUBLICATIONS

Rosenberg et al., Standards Track, SIP: Session initiation Protocol, Jun. 2002, pp. 1-269, RFC 3261, The Internet Society.
Sony Corporation, Network Speaker Operating instructions, 2012, pp. 1-60, SA-NS500, 4-295-601(1), China, http://www.sony.net/sans.
Sony Electronics Inc., Sony Wireless Network Speakers, 2011, 2 pages.
WiFi Allienace, Wi-Fi Protected Setup Specification, Version 1.0h, Dec. 2006, pp. 1-110.
Galaxy Nexus, Android mobile technology platform 4.0 User's Guide, 2011, pp. 1-107.
Kissell, Mac Security Bible: The book you need to succeed!, Covers the standard and server versions of Mac OS® X 10.5 Leopard® and Mac OS® X 10.6 Snow Leopard, pp. 1-940.

\* cited by examiner

WOODEN OR OTHER DIELECTRIC CAPACITIVE TOUCH INTERFACE AND LOUDSPEAKER HAVING SAME

PRIORITY CLAIM

The present application is a continuation of U.S. application Ser. No. 17/066,047, filed Oct. 8, 2020, which is a continuation of U.S. application Ser. No. 16/997,004, filed Aug. 19, 2020, now U.S. Pat. No. 10,856,059, which is a continuation of U.S. application Ser. No. 16/152,014, filed Oct. 14, 2018, now U.S. Pat. No. 10,785,550, which is a continuation of U.S. application Ser. No. 15/468,590, filed Mar. 24, 2017, now U.S. Pat. No. 10,291,972, which is a continuation of U.S. application Ser. No. 14/094,277, filed Dec. 2, 2013, now U.S. Pat. No. 9,628,880, issued Apr. 18, 2017.

CROSS-REFERENCE TO RELATED APPLICATIONS

The present application is related to U.S. patent application Ser. No. 17/194,883, filed Mar. 9, 2021, which issued as U.S. Pat. No. 11,310,574 on Apr. 19, 2022.

The present application also is related to U.S. patent application Ser. No. 13/832,719, filed Mar. 15, 2013, entitled "Configuring Wireless Devices for a Wireless Infrastructure Network," now U.S. Pat. No. 9,060,288, issued on Jun. 16, 2015, which is incorporated herein by reference in its entirety. The following patents and applications claims priority to U.S. Pat. No. 9,060,288: Ser. No. 14/702,316, now U.S. Pat. No. 9,185,168; Ser. No. 14/850,508, now U.S. Pat. No. 9,326,304; Ser. No. 15/080,940, now U.S. Pat. No. 9,629,190; Ser. No. 15/463,559, now U.S. Pat. No. 9,992,061; Ser. No. 15/927,262, now U.S. Pat. No. 10,079,717; Ser. No. 16/057,360, now U.S. Pat. No. 10,298,451; Ser. No. 16/375,428, now U.S. Pat. No. 10,601,652; Ser. No. 16/528,173, now U.S. Pat. No. 10,680,884; Ser. No. 16/528,186, now U.S. Pat. No. 10,560,323; and Ser. No. 16/875,351.

The present application is also related to U.S. patent application Ser. No. 14/031,938, filed Sep. 19, 2013, entitled "Wireless Earphone Set," which application is a continuation of U.S. patent application Ser. No. 13/609,409 filed Sep. 11, 2012, which is a continuation of U.S. patent application Ser. No. 13/459,291 filed Apr. 30, 2012, now U.S. Pat. No. 8,571,544, which is a continuation of U.S. patent application Ser. No. 12/936,488, filed Dec. 20, 2010, now U.S. Pat. No. 8,190,203, which is a national stage entry of PCT/US09/39754, filed Apr. 7, 2009, which claims priority to U.S. provisional patent application Ser. No. 61/123,265, filed Apr. 7, 2008, all of which are incorporated herein by reference in their entirety. The following patents and applications also claim priority to PCT Application No. PCT/US09/39754 and U.S. provisional patent application Ser. No. 61/123,265: Ser. No. 14/695,696, now U.S. Pat. No. 9,438,987; Ser. No. 15/082,040, now U.S. Pat. No. 9,497,535; Ser. No. 15/293,785, now U.S. Pat. No. 9,729,959; Ser. No. 15/650,362, now U.S. Pat. No. 9,986,325; Ser. No. 15/962,305, now U.S. Pat. No. 10,206,025; Ser. No. 16/182,927, now U.S. Pat. No. 10,368,155; Ser. No. 16/375,879, now U.S. Pat. No. 10,469,934; Ser. No. 16/528,701, now U.S. Pat. No. 10,491,982; Ser. No. 16/528,703, now U.S. Pat. No. 10,506,325; Ser. No. 16/528,705, now U.S. Pat. No. 10,528,706, now U.S. Pat. No. 10,757,498; Ser. No. 16/881,488; Ser. No. 16/884,691, now U.S. Pat. No. 10,848,851; Ser. No. 16/900,035, now U.S. Pat. No. 10,848,852; Ser. No. 17/070,295, now U.S. Pat. No. 10,959,011; Ser. No. 17/070,363, now U.S. Pat. No. 10,959,012; Ser. No. 17/178,946; and Ser. No. 17/649,928.

BACKGROUND

A typical capacitive touchscreen panel consists of an insulator such as glass, coated with a transparent conductor such as indium tin oxide (ITO). When a human finger touches the surface of the screen, a distortion of the screen's electrostatic field results, measurable as a change in capacitance, because the human body is also an electrical conductor. Different technologies may be used to determine the location of the touch. The location is then sent to a controller for processing. Capacitive touchscreens are often used for user interfaces, such as in smartphones, tablet computers, etc.

SUMMARY

In one general aspect, the present invention is directed to wireless-enabled loudspeaker with a wooden or other dielectric capacitive touch user interface. The loudspeaker may comprise at least one electroacoustic transducer for producing audible sound, a processor in communication with the at least one electroacoustic transducer, and a wooden (or other dielectric) exterior surface comprising a capacitive touch user interface that allows a user to control operation of the loudspeaker. The capacitive touch user interface may comprise at least one capacitive sense electrode in communication with the processor, and the wooden exterior surface acts a dielectric for the capacitive touch user interface. In various implementations, the loudspeaker further comprises a wireless transceiver circuit in communication with the processor, wherein the wireless transceiver circuit is for receiving and transmitting wireless communication signals via a wireless network (e.g., a WiFi wireless network). As such, the wireless transceiver circuit may receive wirelessly audio content for playing by the loudspeaker via the wireless network; the processor may process the audio content; and the electroacoustic(s) transducer may audibly output the audio content. The wireless transceiver circuit may receive audio content from streaming audio content servers that are connected to the Internet.

In various implementations, the capacitive touch user interface comprises a plurality of user control icons etched or otherwise fixed into the wooden (or other dielectric) exterior surface, and a plurality of capacitive sense electrodes located under the wooden exterior surface. There may be at least one capacitive sense electrode for each one of the plurality of user control icons. The plurality of user control icons may comprise, for example, a volume control to control the volume of the sound output by the loudspeaker and an on/off control for the loudspeaker. There may be a plurality of side-by-side capacitive sense electrodes associated with the volume control icon, forming a slider capacitive sensor. The loudspeaker may also include a next stream control that, when activated by the user, causes the wireless transceiver circuit to switch from receiving streaming audio from a first streaming audio content server to receiving streaming audio from a second streaming audio content serer. Addresses for the first and second streaming audio content servers may be stored in a memory unit of the loudspeaker. In addition, the loudspeaker may also include a control that, when activated by the user, causes the wireless transceiver circuit to transmit an indication for a track being played by the loudspeaker to be transmitted to a remote server system that is connected to the Internet. The indication for the track may be an indication of approval by the user for the track and/or the remote server system may comprise a social media website server system.

These and other benefits of the present invention will be apparent from the description that follows.

FIGURES

Various embodiments of the present invention are described herein by example with reference to the following figures.

DESCRIPTION

Figure 1:
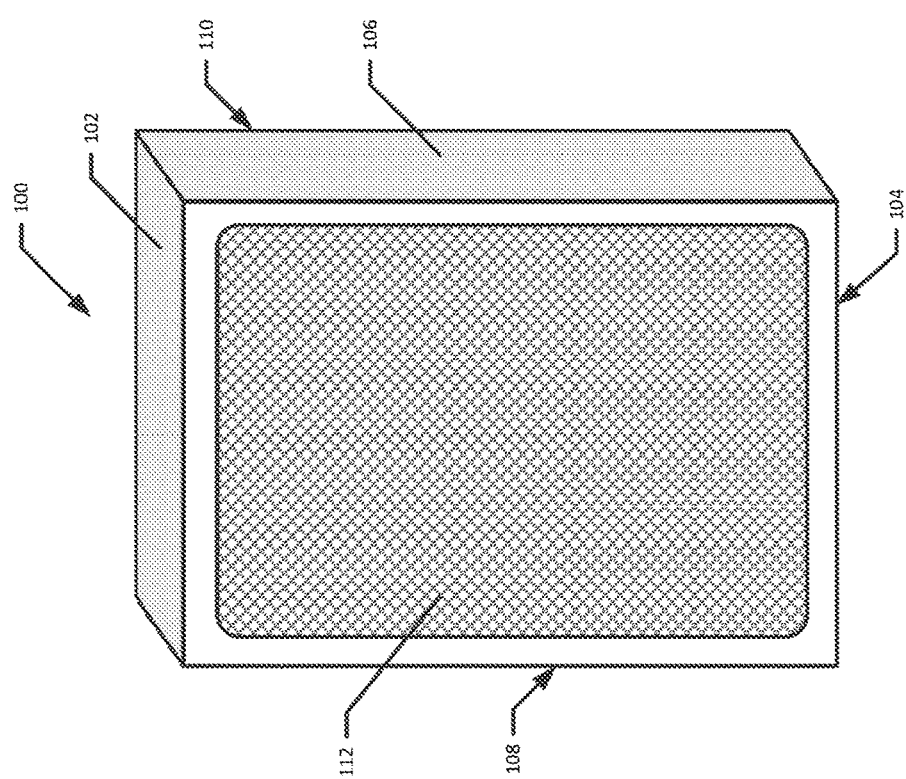
FIG. 1 is a front perspective view of a loudspeaker according to various embodiments of the present invention.
Figure 2:
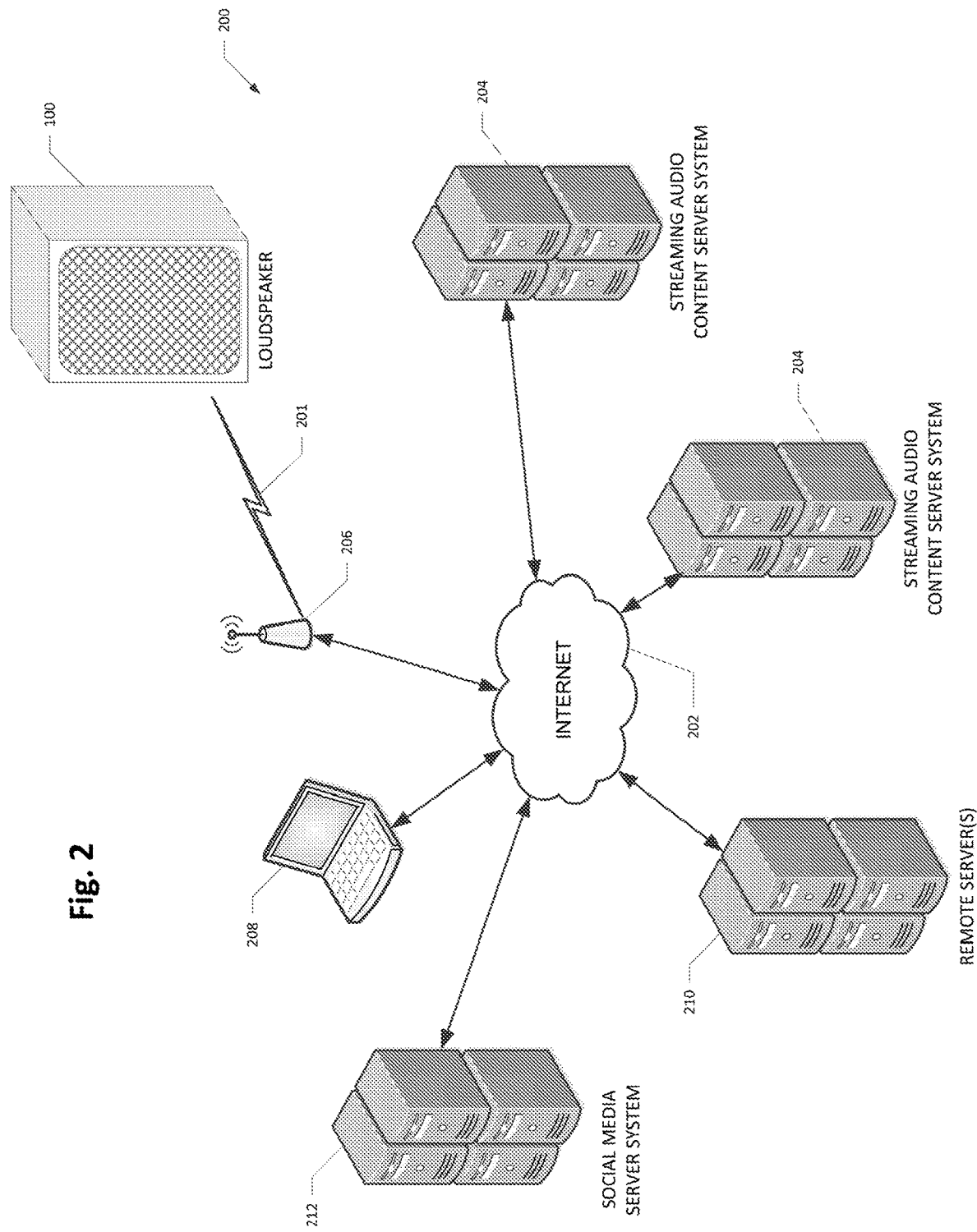
FIG. 2 is a diagram of a network system in which the loudspeaker may be used according to various embodiments of the present invention.

In one general aspect, the present invention is directed to wireless-enabled loudspeaker with a wooden or other dielectric capacitive touch user interface, and preferably a projected capacitance user interface. FIG. 1 is a view of the loudspeaker 100 and FIG. 2 is a diagram of a wireless communication network 200 that includes the loudspeaker 100 according to various embodiments of the present invention. The loudspeaker may 100 may receive content wirelessly for playing (i.e., audio), for example, via a wireless communication link 201, such as a Wi-Fi network or other suitable wireless network. With a Wi-Fi network, for example, the loudspeaker 100 may connect to the Internet 202 via an access point 206 so that the loudspeaker 100 can access and receive wirelessly audio streams from streaming audio content server systems 204 that are on (or connected to) the Internet 202. Two such streaming audio content server systems 204 are show in FIG. 2 for simplicity, although there could be many more. As described in more detail below, a user of the loudspeaker 100 may use a computer 208 to help configure or set-up the loudspeaker 100 for use. The computer 208 may be any computer device that is suitable for configuring the loudspeaker 100, such as a PC, laptop, tablet computer, smartphone, etc., and that is connectable to the Internet 202 (as most computers are). The user may use the computer 208 to access a web site hosted by a remote server 210 in configuring the loudspeaker 100. The remote server 210 may also store configuration parameters for the loudspeaker 100, as described further below.

Figure 8:
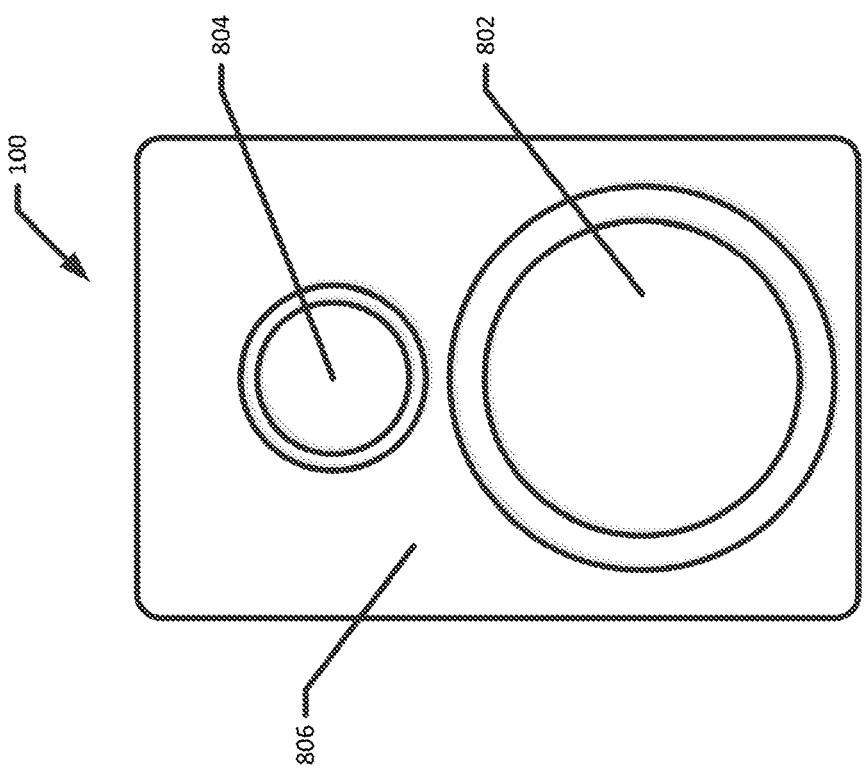

The loudspeaker 100 may be made primarily of a dielectric material, such as wood. For example, ash or any other suitable wood could be used. In such an embodiment, the loudspeaker 100 may comprise wooden top 102, bottom 104, side 106, 108, and back 110 surfaces. A front surface may comprise, for example, an acoustical grate 112 (e.g., a perforated steel acoustical grate) through which sound emanates. As shown in the example of FIG. 8, one or more speakers, e.g., a mid-range speaker 802 and a tweeter 804, may sit behind the grate 112 and output audio through the grate 112 for listening. The speakers 802, 804 may be surrounded by, and be fastened to, a front wood surface 806. The loudspeaker 100 may have sharp edges/corners as shown in FIGS. 1 and 8, or in other embodiments it could have rounded corners and edges. The size of the loudspeaker 100 may depend on in part the size and number of electroacoustic transducers that are employed (a bigger loudspeaker is obviously needed for more and bigger transducers). The loudspeaker 100 may be, for example, 6" to 24" tall, 6" to 18" wide, and 6" to 18" deep, according to various embodiments, or even larger. In the illustrated embodiments, the loudspeaker 100 is taller than it is wide; in other embodiments it could be wider than it is tall.

Figure 3:
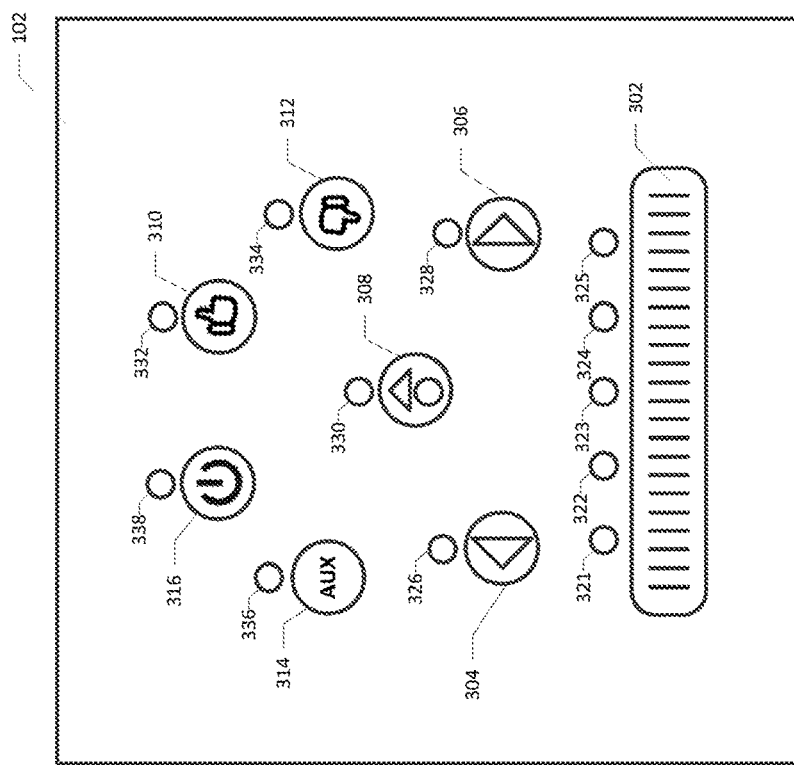
FIG. 3 is a diagram of a capacitive user touch interface on a top, wooden surface of the loudspeaker according to various embodiments of the present invention.

In various embodiments, the top surface 102 may comprise a wooden capacitive touch user interface through which a user may control the loudspeaker 100. FIG. 3 is a top view of the top surface 102 of the loudspeaker 100 showing the capacitive touch user interface according to one embodiment of the present invention. The interface may include several controls, whose corresponding icons may be laser-etched in the wood of the top surface 102. The controls may include, for example: a volume control 302; a next track control 304; a previous track control 306; a next stream control 308; a positive feedback control 310; a negative feedback control 312; an auxiliary control 314; and a power (on/off) control 316. These controls may use the wood of the wooden top surface 102 as the dielectric between the user's finger and the corresponding electrode for the control. The user can contact the capacitive controls or come in close proximity to them in order for the user's commands to be sensed. In addition, each of the controls 302-316 may have associated LED pipes 321-338 that emit when their corresponding control is activated. The LED pipes may be made from an optically translucent material, such as acrylic, and may pipe light energy from corresponding LEDs (not shown) to the top surface 102 of the loudspeaker 100.

In various embodiments, the volume control 302 may be implemented with a capacitive slider sensor. The user can increase the playback volume by sliding their finger from left to right, and decrease the playback volume by sliding their finger from right to left. The other controls may be implemented, for example, with capacitive buttons. There may be multiple LED pipes associated with the volume control 302, such as the five (LEDs 321-325) shown in FIG. 2 or a different quantity. The LED 321-325 may illuminate in correspondence to the position of the user's finger as the user slides his/her finger across the volume control 302. For example, when the user slides his/her finger from left to right on the volume control 302 to increase the volume, first LED 321 may activate, and then the other LEDs 322 up to 325 may activate in sequence as the user slides his/her finger from left to right on the volume control 302 depending on where the user stops. Conversely, when the user slides his/her when the user slides his/her finger from right to left on the volume control 302 to decrease the volume, first all of the LEDs 321-325 may activate, and then the other LEDs 325 down to 322 may turn off in sequence as the user slides his/her finger from right to left on the volume control 302 depending on where the user stops. LEDs 321-325 may stay on for a short period of time, such as until the user removes his/her finger from the volume control 302, or a short time thereafter.

The next stream button 308 allows the user to advance to the next stream. The streams may be, for example, audio streams from different sources received wirelessly by the loudspeaker 100 via the wireless network. For example, the streams could be from the streaming audio content server systems 204 connected to the Internet 202 (see FIG. 2), where the loudspeaker 100 receives the streams via the wireless network 201. There may be a pre-established order associated with the streaming audio content server systems 204 (e.g., stored by the remote server 210 and established by the user through computer 208), and clicking the next stream button 308 causes the loudspeaker 100 to connect to the next streaming audio content server 204 in the pre-established order. Clicking the next stream button 308 may cause its corresponding LED 330 to illuminate for a brief period of time. The next and previous track controls 304, 306 allow the user to advance to the next or prior audio tracks in a stream, respectively. Clicking the next and previous track controls 304, 306 may cause their corresponding LEDs 326, 328 to illuminate for a brief period of time, respectively.

By touching (or coming within sufficiently close proximity) to the positive feedback control 310 or negative feedback control 312, the user may indicate positive or negative feedback respectively for a song or other track being played by the loudspeaker 100. For example, when the user activates the positive (or negative) feedback control 310 (312), an indication of the user's approval (or disapproval) of the track currently being played by the loudspeaker 100 may be sent via the wireless network 201 and the Internet 202 to the remote server 210. The remote server 210 may store data related to the tracks that the user of the loudspeaker 100 approves and disapproves. Clicking the positive feedback control 310 and/or negative feedback control 312 may cause their corresponding LEDs 332, 334 to illuminate for a brief period of time, respectively.

In yet other embodiments, additionally or alternatively, the capacitive user interface could include a control (not shown) that causes data about the track currently being listened to on the loudspeaker to be sent to a social media server system(s) 212, such as Twitter, Facebook, Google+, etc. Upon receipt of such data, the social media site may indicate that the user is listening to or enjoying or playing the track.

With the auxiliary control 314, the user can switch the input source for the loudspeaker 100. For example, in various embodiments, the loudspeaker 100 comprises, on the back surface 110, an audio input jack (not shown). For example, the loudspeaker 100 may comprise a female audio receptacle sized to accommodate a TRS, TS, TRRS or any other suitable audio connector. That way (with for example an audio cable with two male audio connectors), the user could connect a digital personal audio player (e.g., an iPod or other similar device) to the loudspeaker 100 such that the loudspeaker 100 can output audio from the digital personal audio player. Alternatively or additionally, the loudspeaker 100 may comprise other input means for connecting to other audio sources, such as a USB input, an optical audio connector input, etc. The user may cycle between these different sources (including the wireless source) by activating the auxiliary control 314. Clicking the auxiliary control 314 may cause its corresponding LED 336 to illuminate for a short period of time.

The power control 316 may be used to turn on and off the loudspeaker 100. The LED 338 for the power control 316 may illuminate when the loudspeaker 100 is turned on.

Figure 4:
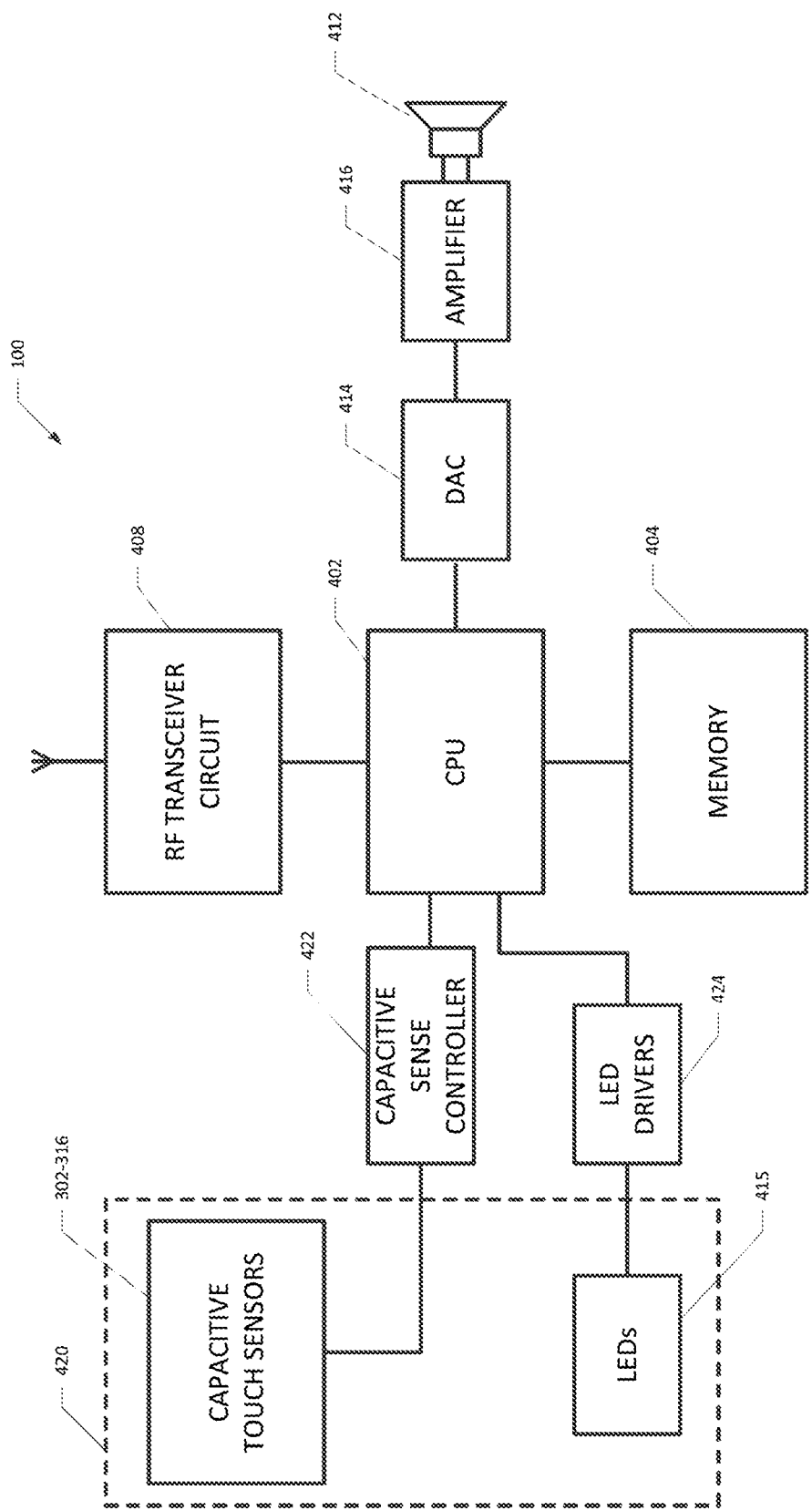
FIG. 4 is a block diagram of components of the loudspeaker according to various embodiments of the present invention.

FIG. 4 is a simplified block diagram of the loudspeaker 100 according to various embodiments. As shown in FIG. 4, the loudspeaker 100 may comprise a central processing unit (CPU) 402 and one or more external memory units 404. The external memory unit(s) 404 may comprise non-volatile memory, such as NAND flash memory. In addition, the CPU 402 may include internal volatile (e.g., RAM) and/or non-volatile (e.g., ROM) memory. Collectively, the internal and external memory may store software and/or firmware instructions or code that are executed by the CPU 402 to control the operation of the loudspeaker 100. Preferably, the CPU 402 comprises digital audio processing capabilities, such as an AMS model AS3531 digital audio processor or other suitable digital audio processor.

Also as shown in FIG. 4, the loudspeaker 100 may comprise a RF transceiver circuit 408 connected to the CPU 402 that handles radio/wireless communications by the loudspeaker 100. In various embodiments, the RF transceiver circuit 408 may be a separate chip from the CPU 402 (as shown in FIG. 4) or it could be integrated with the CPU 402. The wireless communication may use any suitable wireless communication protocol, and preferably a protocol that is capable of communicating with the Internet 202 through the access point 206 (see FIG. 2), such as the Wi-Fi protocols (such as IEEE 802.11 a, b, g, and/or n), or WiMAX (IEEE 802.16), or any other suitable protocol. In operation, therefore, streaming audio from one of the streaming audio content server systems 204 (or other wireless audio source) may be received by the RF transceiver circuit 408 via the Internet 202 (or other data communications network) and processed by the CPU 402. In an embodiment where the RF transceiver circuit 408 is a separate chip from the CPU 402, the RF transceiver circuit 408 may be implemented with, for example, a NanoRadio NRG731 chip. The received audio may be output by one or more speakers (e.g., electroacoustic transducers) 412 after being converted from digital to analog by a digital-to-analog converter (DAC) 414 and amplified by an audio power amplifier 416. Although only one speaker 412 is shown in FIG. 4, it should be recognized that the multiple speakers could be used, such as mid-range, tweeter, bass, woofer and/or sub-woofer speakers. In one embodiment, the loudspeaker 100 may be a mono (one channel) speaker system and could be paired with another (or additional) loudspeakers on different channels to create a stereo (or surround) speaker system.

Also as shown in FIG. 4, the loudspeaker 100 may comprise the capacitive touch sensors 302-316 and LEDs 415 for the corresponding LED pipes 321-338 that are part of the capacitive user interface 420. More details about the capacitive touch sensors 302-316 and the LED pipes 321-338 are shown in connection with FIGS. 5-6. Also, the loudspeaker 100 may comprise a capacitive sense controller 422 for controlling the capacitive touch sensors 302-316 and interfacing with the CPU 402. Any suitable capacitive sense controller 422 may be used, such as for example, a C8051F996 capacitive sensing MCU from Silicon Labs. In addition, one or more LED drivers 424 may be used as needed to drive the LEDs 321-338; any suitable LED driver may be used, such as for example, a SX1509QB LED driver from Semtech.

Figure 6:
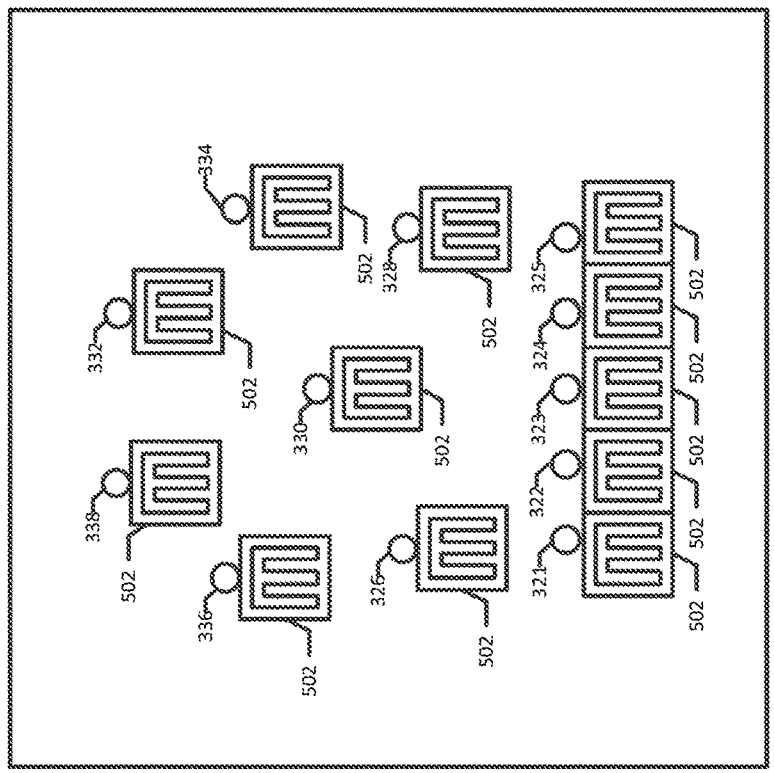
FIGS. 5-6 are diagrams of capacitive touch electrodes according to various embodiments of the present invention.
Figure 5:
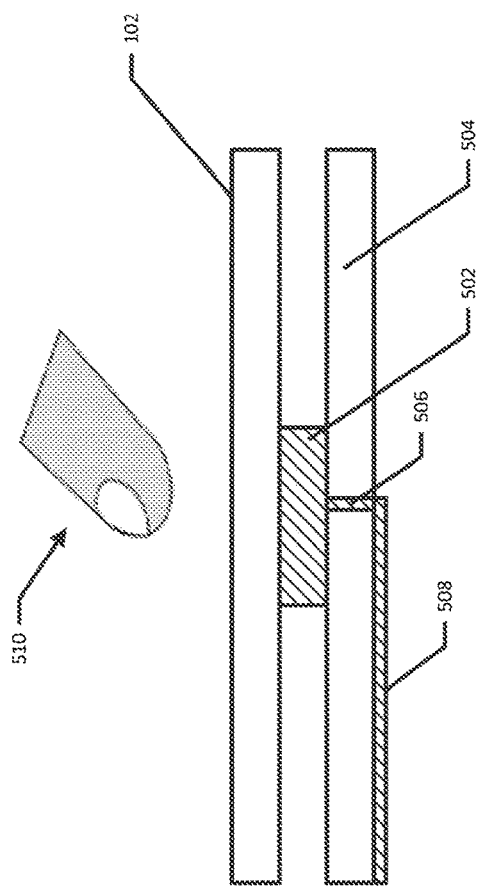

FIGS. 5 and 6 show more details about the wooden capacitive touch user interface according to various embodiments of the present invention. FIG. 5 is a simplified side-view of the wooden capacitive touch user interface.

This figure shows the wooden top surface 102 of the loudspeaker adjacent to an electrode 502 that is mounted on a top side of a printed circuit board 504. The electrode 502 may be connected to other components, such as the capacitive sense controller 422, by a conductive via 506 through the printed circuit board 504 and a conductive trace 508 on the underside of the printed circuit board. The capacitive sense controller 422 may be mounted, for example, to the underside of the printed circuit board 504 or to another printed circuit board (not shown). The printed circuit board 504 may be constructed of a dielectric material such as FR4. Also, the wooden top surface 102 acts as dielectric. Consequently, when a user brings their finger 510 proximate to the electrode 502, the capacitive fields of the electrode 502 are altered since the user's finger acts an electrode of a capacitor, with the wooden top surface 102 acting as dielectric therebetween. This change in capacitance can be detected, such as by the capacitive sense controller 422, to determine whether the user has activated the control associated with the electrode 502.

FIG. 6 is a top view of the printed circuit board 504 that may be underneath the wooden top surface 102. As shown in FIG. 6, each of the controls 302-316 (see FIG. 3) has at least one associated electrode 502. The electrodes 502 shown in FIG. 6 are interdigitated electrodes, although in other embodiments one or more of the electrodes 502 could have other structures, such as disc electrodes, etc. As shown in FIG. 6, the volume control 302 may comprise multiple electrodes 502 in a row to form a slider sensor to detect movement of the user's finger across the volume control 302. FIG. 6 also shows the LED pipes 321-338. The LEDs 415 (shown in FIG. 4) may be below the printed circuit board 504, and their light energy is carried by the light pipes 321-338 through the printed circuit board 504 to the top wooden surface 102.

The loudspeaker 100 may be powered by an external AC-DC in-line power supply and/or internal batteries.

Figure 9:
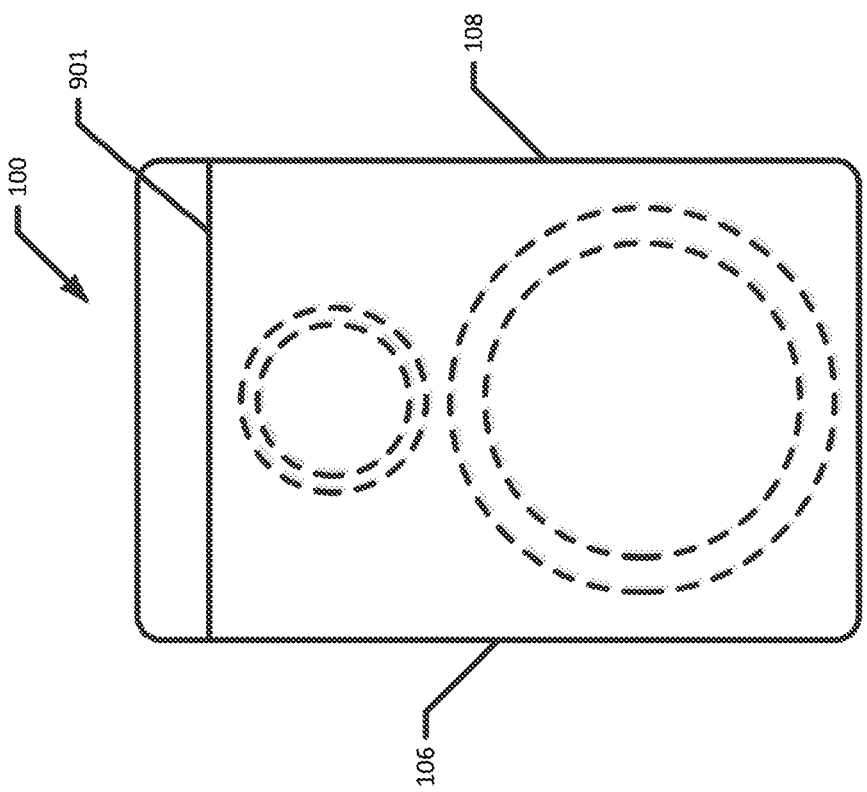
FIGS. 8 and 9 are diagrams of the electroacoustic transducers of the loudspeaker according to various embodiments of the present invention.

FIG. 9 is a diagram of the back of the loudspeaker 100 with the back wooden panel removed. As shown in FIG. 9, the interior of the loudspeaker may include, for example, a wooden shelf 901 toward the top of the loudspeaker 100. The printed circuit boards for various electrical components and chips (e.g., the CPU 402, the RF transceiver circuit 408, the external memory 404, etc.) may be mounted to or otherwise attached to a top of the shelf 901. Caulk may be used to secure the shelf 901 to the interior sides of the wooden side surfaces 106, 106.

Figure 7:
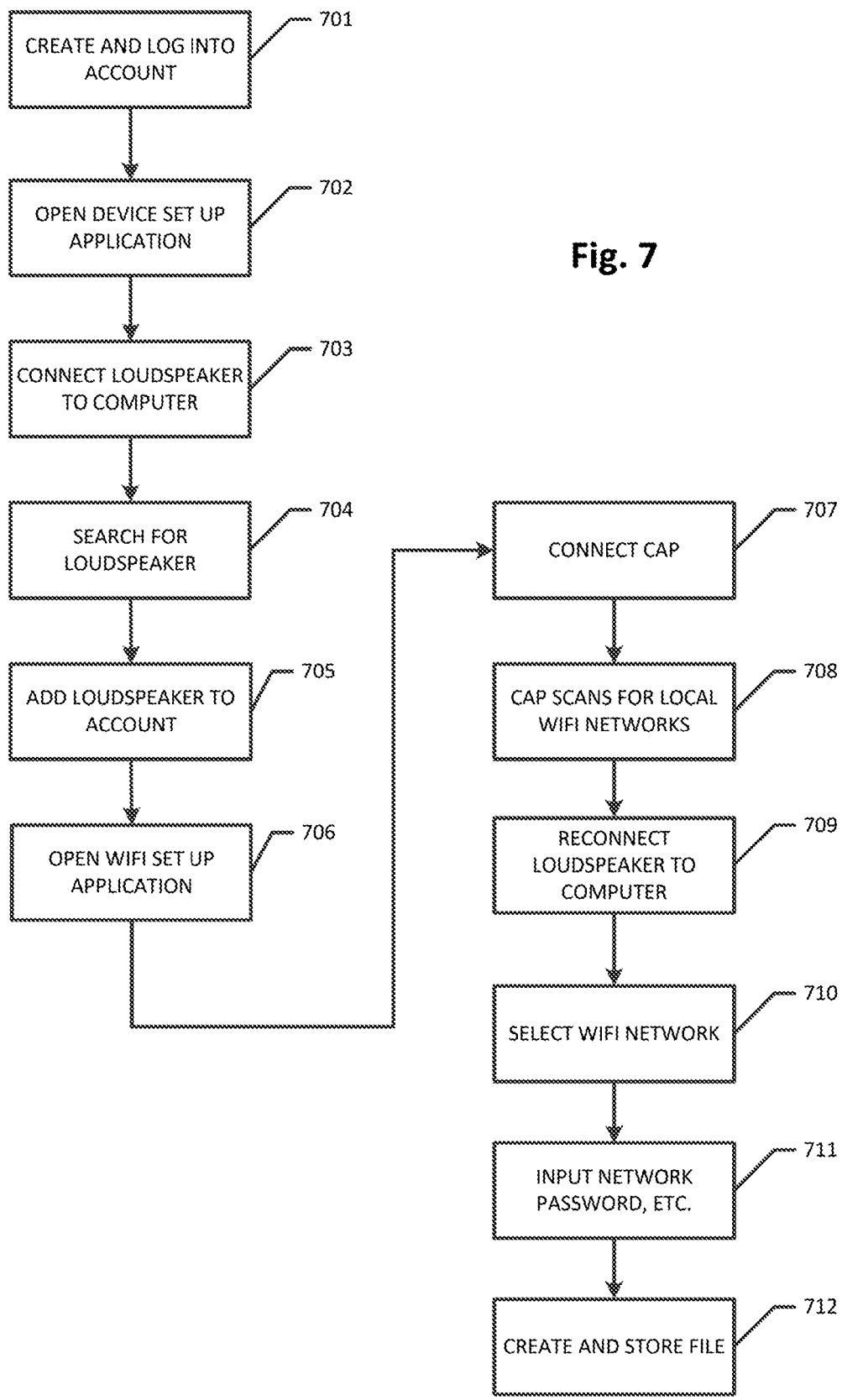
FIG. 7 is a flowchart of a process for configuring the loudspeaker for communicating on a wireless network according to various embodiments of the present invention.

To configure the loudspeaker 100 for wireless operation, two things preferably must happen. First, the loudspeaker 100 should be associated with a user's account; second, it should be provisioned to work on a WiFi (or other wireless) network. The user may have an account with an Internet service that manages the wireless loudspeaker 100 and/or other wireless audio and/or video devices that the user may have. The Internet service for managing the wireless device, including the loudspeaker 100, may be hosted by the remote server system 210 (see FIG. 2), for example. The user may access the remote server system 210 via the Internet 202 from the user's computer 208. FIG. 7 is a flowchart depicting a process to configure or set up the loudspeaker 100 for use, and in particular to connect to the WiFi (or other wireless) network, according to various embodiments of the present invention. At step 701, if the user does not already have an account with the service, the user sets up an account with the remote server system 210 and logs into their account. The user may set up the account by logging onto a web site hosted by the remote server system 210 that is accessible through the Internet 202 by the user's computer 208. Once logged in, the user opens a device set up application (e.g., an applet) from the website at step 702 and at step 703 plugs the loudspeaker 100 into the computer 208, such as via a USB cable (the back of the loudspeaker 100 may have a USB port). The set up application may have a "search" button that, when activated by the user at step 704 at the user's computer 208, searches for the loudspeaker 100. Once the loudspeaker 100 is found, its device ID is displayed in the set up application and the user may, at step 705, again through the set up application, elect to add the loudspeaker 100 to the user's account. Once the loudspeaker 100 is added to the user's account, it may now be provisioned for the WiFi network. At step 706, a WiFi set up application may be opened from the web site. Then, at step 707 the loudspeaker is disconnected from the computer 208 and, according to various embodiments, a content access point (CAP) is connected to the computer 208, again through a USB port, for example. The CAP may be a device that scans for local WiFi networks. More details about a suitable CAP can be found in U.S. patent application Ser. No. 13/832,719, filed Mar. 15, 2013, entitled "Configuring Wireless Devices for a Wireless Infrastructure Network," issued as U.S. Pat. No. 9,060,288 on Jun. 16, 2015, and in U.S. Pat. No. 8,190,203, issued Nov. 29, 2012, entitled "Wireless Earphone That Transitions Between Wireless Networks," both of which are hereby incorporated herein by reference in their entirety. At step 708, the CAP scans for local wireless networks. Assuming one or more are found, identifiers (e.g., names) for the found networks will appear in the WiFi set up application. Then, at step 709 the CAP is disconnected from the computer 208 and the loudspeaker 100 is reconnected. Next, at step 710 the desired WiFi network can be selected in the WiFi setup application by the user, at which point then user is prompted to input the password for the WiFi network (and possible encryption type) at step 711. The application may then, at step 712, create a file (e.g., a .bin file) with the network credentials (identifier, password, etc.) and write the file to the loudspeaker 100 (e.g., stored in one of the memory units thereof), which completes the process such that the loudspeaker 100 is assigned to the user's account and configured to work on a local WiFi network. The network credentials are stored in the memory of the loudspeaker 100 so that the loudspeaker 100 can use them to access the WiFi network. Other WiFi networks could be added in a similar manner.

Figure 10:
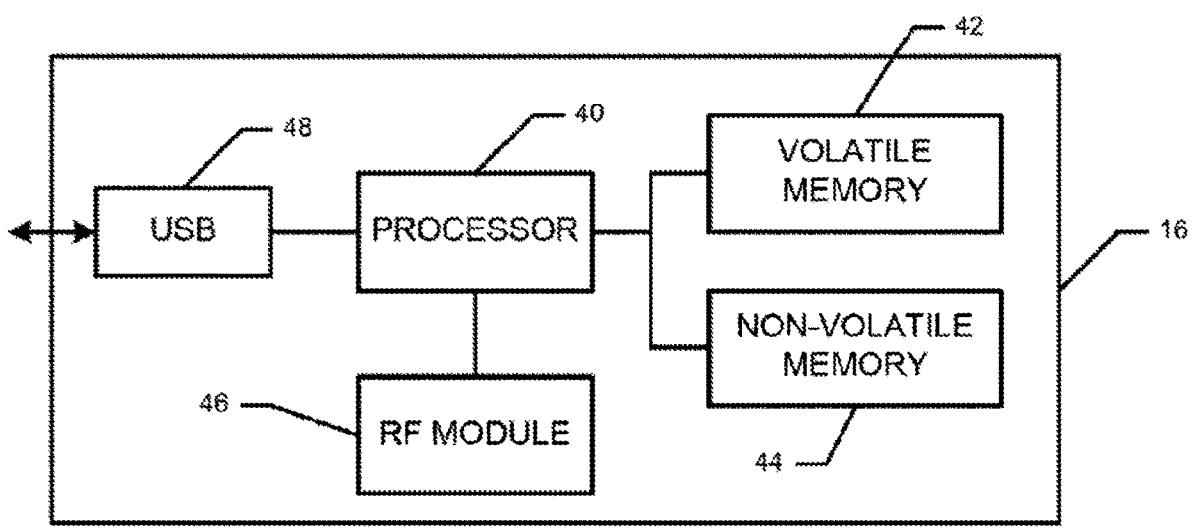
FIG. 10 is simplified block diagram of a content access point (CAP) according to various embodiments of the present invention.

FIG. 10 is simplified block diagram of the CAP 16 according to various embodiments of the present invention. As shown in FIG. 10, the CAP 16 may comprise a processor 40, a volatile memory 42, a nonvolatile memory 44, a RF (or radio or Wi-Fi) module 46 and a USB port 48 or other suitable external interface that allows the CAP 16 to connect to an external device, such as the DAP 20 or the computer 22. The CAP 16 may also include a chargeable power source (not shown) for powering the components of the CAP 16. The RF module 46 may handle radio/wireless communications by the CAP 16. For example, the RF module 46 may allow the CAP to communicate via a wireless communication protocol, preferably Wi-Fi, with the speaker device or a wireless access point 206. The memory units 42, 44 may store software instructions for execution by the processor 40 that control the function and operation of the CAP 16. In addition, in various embodiments, the speaker device and the CAP 16 are part of a conjoined assembly, such that the CAP 16 is configured at manufacture to know the identifiers for the speaker device. That is, the non-volatile memory 44 may store addresses (e.g., IP addresses) for the speaker device. Also, the CAP 16 may be an integral part of a digital audio player (e.g., a device that stores and plays digital audio files, such as a MP3 player, iPod, iPhone, etc.) or the computer 208.

The CAP 16 may also allow the WiFi credentials to be sent to the speaker device without having to plug the speaker device into the computer 208. The user (e.g., a user of the speaker device), using the Internet-enabled computer 208 with a browser, logs into a website associated with the speaker device, hosted by the remote server(s) 210, and sets up an account (if the user does not already have one). At the website the user can, for example, add Wi-Fi hotspots and specify content channels (e.g., Internet radio stations or other servers connected to the Internet that serve content). To add a Wi-Fi hotspot, the user may click (or otherwise activate) a link on the website that indicates a desire to add a Wi-Fi hotspot. In various embodiments, a JAVA applet from the website may be used by the computer 208 to search for nearby Wi-Fi hotspots, which, upon detection, may be displayed for the user on the website. The user may then click on (or otherwise select) the desired Wi-Fi hotspot to add. If applicable, the website may then prompt the user to enter a password and/or encryption type (e.g., WPA or WPA2) for the selected Wi-Fi hotspot. The SSID, password, and encryption type for the Wi-Fi hotspot is stored for the user's account by the remote server(s) 210. This process could be repeated as necessary to add as many Wi-Fi hotspots as desired by the user.

Next, a user device, e.g., the loudspeaker 100, may be added to the user's account. The user may do this, according to various embodiments, by plugging the CAP 16 into the computer 208. Using a JAVA applet, for example, the IDs for the CAP, as well as the IDs for the speaker device, stored in a non-volatile memory of the CAP, are uploaded to the remote server(s) 210 and stored at the remote server(s) 210 as part of the user's account information. Next, the user may update the speaker device with the Wi-Fi hotspot credentials (e.g., SSID, password if one is used for the hotspot, and/or encryption type). The user may do this by clicking on or otherwise selecting a link on the website to update the speaker device. Upon clicking the link, the CAP transmits the credentials (e.g., SSID, password, encryption type) for each of the added Wi-Fi hotspots to the speaker device, via an ad hoc wireless communication link. This process allows the speaker device to be configured for infrastructure network (and Internet) access without having to physically connect the speaker device to the computer 208 to configure them and without having an existing, different infrastructure network that the speaker device need to connect to.

As mentioned above, the loudspeaker 100 (via the RF transceiver circuit 408) may receive streaming audio from streaming audio content server systems 204 connected to the Internet 202. Using the computer 208, the user may log onto, for example, a web site hosted by the remote server system 210 to configure the streaming audio sources 204 for the loudspeaker 100. For example, in one embodiment, through the web site the user can specify a number of streaming audio content server systems 204 to which the user desired to listen at various times in the future. The user may also specify a cycling sequence or queue for the streaming audio content server systems 204. The IP addresses and the desired sequence for those streaming audio content server systems 204 may be downloaded to the loudspeaker from the remote server 210 wirelessly or from the computer 208, for example, and stored in a memory unit of the loudspeaker 100, e.g., external memory unit 404 and/or memory units internal to the CPU 402. When the loudspeaker is in use, and the user activates the next stream control 308, the RF transceiver circuit 408 can retrieve (or be sent by the CPU 402) the address for the next streaming audio content server system 204 in the queue and connect to the streaming audio content server system 204 via the wireless link 201 and the Internet 202 so that audio from the next streaming audio content server system 204 can be played by the loudspeaker 100.

The above embodiments are generally described in the context of a wooden capacitive touch user interface. In other embodiments, however, other dielectrics could be used. For example, in such embodiments, the exterior surface of the loudspeaker 100 that has the user interface could comprise other dielectric materials besides wood, such as thermoplastic or other resins (e.g., Teflon, phenolic, epoxy, acetal), fiberglass, MDF (medium density fiberboard), solid surface materials such as Corian®, glass, stone, etc. In such embodiments, substantially of the exterior surfaces (e.g., top surface 102) could be made of the dielectric, or just the exterior surface(s) with the capacitive touch user interface. According to such embodiments, the control icons 302-316 may be etched, printed on, or otherwise fixed to the exterior surface (e.g., top surface 102). And the LED pipes 321-338 may be used with any of the dielectric overlay materials. Further, for all dielectric overlay materials, the thickness of the dielectric overlay may be selected based on mechanical/ESD robustness (the thicker the better), power consumption (the thinner the better), and the dielectric properties of the material. The thickness may be about ⅛" for a wooden (ash) overlay, for example.

In various embodiments, therefore, the present invention is directed generally to a loudspeaker 100 that comprises at least one electroacoustic transducer 802, 804 for producing audible sound, a processor 402 in communication with the at least one electroacoustic transducer, and a wooden exterior surface (e.g., top surface) 102 comprising a capacitive touch user interface 420 that allows a user to control operation of the loudspeaker. The capacitive touch user interface 420 comprises at least one capacitive sense electrode 502 in communication with the processor 402, and the wooden exterior surface 102 acts a dielectric for the capacitive touch user interface. In various implementations, the loudspeaker 100 further comprises a wireless transceiver circuit 408 in communication with the processor 402, wherein the wireless transceiver circuit 408 is for receiving and transmitting wireless communication signals via a wireless network (e.g., a WiFi wireless network). As such, the wireless transceiver circuit 408 may receive wirelessly audio content for playing by the loudspeaker 100 via the wireless network; the processor 402 may process the audio content; and the at least one electroacoustic transducer 802, 804 may audibly output the audio content. The wireless transceiver circuit 408 may receive audio content from one or more streaming audio content servers 204 that are connected to the Internet 202.

In various implementations, the capacitive touch user interface 420 comprises a plurality of user control icons 302-316 etched in the wooden exterior surface 102, and a plurality of capacitive sense electrodes 502 located under the wooden exterior surface 102. There may be at least one capacitive sense electrode 502 for each one of the plurality of user control icons 302-316. The plurality of user control icons may comprise, for example, a volume control 302 to control the volume of the sound output by the loudspeaker 100 and an on/off control 316 for the loudspeaker 100. There may be a plurality of side-by-side capacitive sense electrodes associated with the volume control icon, forming a slider capacitive sensor. The loudspeaker 100 may also include a next stream control 308 that, when activated by the user, causes the wireless transceiver circuit 408 to switch from receiving streaming audio from a first streaming audio content server to receiving streaming audio from a second streaming audio content serer. Addresses for the first and second streaming audio content servers may be stored in a memory unit 404 of the loudspeaker 100. In addition, the loudspeaker 100 may also include a control that, when activated by the user, causes the wireless transceiver circuit 408 to transmit an indication for a track being played by the loudspeaker to be transmitted to a remote server system 210, 212 that is connected to the Internet 202. The indication for the track may be an indication of approval by the user for the track and/or the remote server system may comprise a social media website server system 212.

In another general embodiment, the loudspeaker 100 comprises the electroacoustic transducer(s) 802, 804, for producing audible sound; the processor 402; and the capacitive touch user interface 420 on an exterior surface 102 of the loudspeaker 100 that allows a user to control operation of the loudspeaker 100. The capacitive touch user interface 420 comprises at least one capacitive sense electrode 520 in communication with the processor 402; the exterior surface 102 is a dielectric for the capacitive touch user interface 420; and a plurality of user control icons 302-316 for the capacitive touch user interface 420 are fixed (e.g., etched) on the exterior surface 102. In various implementations, the loudspeaker 100 may further comprise a plurality of light emitting diodes (LEDs) 415 located below the exterior surface 102; and a plurality of LED pipes 321-338 for carrying light energy from the LEDs 415 to the exterior surface 102.

In various embodiments disclosed herein, a single component may be replaced by multiple components and multiple components may be replaced by a single component to perform a given function or functions. Except where such substitution would not be operative, such substitution is within the intended scope of the embodiments.

While various embodiments have been described herein, it should be apparent that various modifications, alterations, and adaptations to those embodiments may occur to persons skilled in the art with attainment of at least some of the advantages. For example, in some instances different materials or components may be used. The disclosed embodiments are therefore intended to include all such modifications, alterations, and adaptations without departing from the scope of the embodiments as set forth herein.

What is claimed is:

1. A system comprising:
    a computing device of a user;
    a remote server configured to store credential data for a pre-specified infrastructure wireless network, wherein the credential data are pre-specified by the user; and
    a loudspeaker comprising:
        an enclosure comprising a base surface, at least one sidewall, and a smooth top surface that collectively define a volume, wherein the smooth top surface comprises a dielectric material coupled to a capacitive touch user interface comprising at least one capacitive sense electrode, wherein the capacitive touch user interface is configured such that the user can control the loudspeaker by touching the smooth top surface of the loudspeaker;
        one or more speakers disposed within the volume; and
        a wireless communication circuit disposed within the volume, wherein the wireless communication circuit is configured to:
            receive, via an ad hoc wireless communication link, the credential data for the pre-specified infrastructure wireless network from the computing device, wherein the credential data comprises a network ID and a password for the pre-specified infrastructure wireless network;
            connect to the pre-specified infrastructure wireless network; and
            receive, via the pre-specified infrastructure wireless network, an audio stream from an audio content server, wherein the one or more speakers are configured to play the audio stream.

2. The system of claim 1, wherein the remote server is communicably coupled to the computing device, and wherein the computing device is configured to receive an input comprising the credential data for the pre-specified infrastructure wireless network for storage on the remote server.

3. The system of claim 1, wherein the one or more speakers comprise:
    a low-frequency speaker; and
    a high-frequency speaker.

4. The system of claim 3, wherein:
    the enclosure has rounded edges;
    the enclosure is between 6" and 24" in height when sitting on the base surface;
    the low-frequency speaker comprises at least one subwoofer; and
    the high-frequency speaker comprises at least one tweeter.

5. The system of claim 1, wherein the loudspeaker further comprises:
    a plurality of LEDs; and
    an LED driver coupled to the plurality of LEDs.

6. The system of claim 5, wherein the LED driver is configured to activate at least one LED of the plurality of LEDs, and wherein illumination of the at least one LED corresponds to a particular control of the loudspeaker.

7. The system of claim 6, wherein the corresponding control comprises decreasing a volume output of the one or more speakers.

8. The system of claim 6, wherein the corresponding control comprises increasing a volume output of the one or more speakers.

9. The system of claim 5, further comprising at least one LED indicator that comprises an LED pipe configured to pipe light energy from at least one LED of the plurality LEDs to the a surface of the enclosure of the loudspeaker.

10. The system of claim 1, wherein the loudspeaker further comprises a memory, configured to store the network ID and the password for the infrastructure wireless network.

11. The system of claim 1, wherein the dielectric material comprises plastic.

12. The system of claim 1, wherein the dielectric material comprises wood.

13. The system of claim 1, wherein the dielectric material comprises fiberglass.

14. The system of claim 1, wherein the dielectric material comprises glass.

15. The system of claim 1, wherein the dielectric material comprises glass.

16. A loudspeaker comprising:
    an enclosure comprising a base surface, at least one sidewall, and a smooth top surface that collectively define a volume, wherein the smooth top surface comprises a dielectric material coupled to a capacitive touch user interface comprising at least one capacitive sense electrode, wherein the capacitive touch user interface is configured such that a user can control the loudspeaker by touching the smooth top surface of the loudspeaker;
one or more speakers disposed within the volume;
a plurality of LEDs;
an LED driver coupled to the plurality of LEDs; and
a wireless communication circuit disposed within the volume, wherein the wireless communication circuit is configured to:
receive, via an ad hoc wireless communication link, credential data for a pre-specified infrastructure wireless network from a computing device of the user, wherein the credential data comprises a network ID and a password for the pre-specified infrastructure wireless network;
connect to the pre-specified infrastructure wireless network; and
receive, via the pre-specified infrastructure wireless network, an audio stream from an audio content server, wherein the one or more speakers are configured to play the audio stream.

17. The loudspeaker of claim 16, wherein the credential data are pre-specified by the user by being stored on a remote server, wherein the remote is in communication with the computing device of the user.

18. The loudspeaker of claim 16, wherein the LED driver is configured to activate at least one LED of the plurality of LEDs, and wherein illumination of the at least one LED corresponds to a particular control of the loudspeaker.

19. The loudspeaker of claim 18, wherein the corresponding control comprises decreasing a volume of the audio stream outputted by the one or more speakers.

20. The loudspeaker of claim 18, wherein the corresponding control comprises increasing a volume of the audio stream outputted by the one or more speakers.

21. The loudspeaker of claim 16, wherein the dielectric material comprises glass.

22. The loudspeaker of claim 16, wherein the dielectric material comprises plastic.

23. The loudspeaker of claim 16, further comprising a memory the configured to store the network ID and the password for the infrastructure wireless network.

24. The loudspeaker of claim 16, wherein the one or more speakers comprise:
a low-frequency speaker; and
a high-frequency speaker.

25. The loudspeaker of claim 16, wherein the LED driver is configured to activate at least one LED of the plurality of LEDs, and wherein illumination of the at least one LED corresponds to a particular control of the loudspeaker.

26. The loudspeaker of claim 25, wherein the corresponding control comprises decreasing a volume output of the one or more speakers.

27. The loudspeaker of claim 25, wherein the corresponding control comprises increasing a volume output of the one or more speakers.

28. The loudspeaker of claim 16, further comprising at least one LED indicator that comprises an LED pipe configured to pipe light energy from at least one LED of the plurality LEDs to the a surface of the enclosure of the loudspeaker.

29. The loudspeaker of claim 16, wherein the dielectric material comprises thermoplastic.

30. The loudspeaker of claim 16, wherein the at least one sidewall is rounded.

31. The loudspeaker of claim 30, wherein the at least one sidewall comprises a perforated acoustical grate.

32. The loudspeaker of claim 16, wherein the at least one sidewall comprises a perforated acoustical grate.

* * * * *